US012595586B2

(12) United States Patent
Chen et al.

(10) Patent No.: US 12,595,586 B2
(45) Date of Patent: Apr. 7, 2026

(54) QUALITY CONTROL METHOD FOR GROWING SILICON CARBIDE CRYSTAL

(71) Applicant: Winsheng Material Technology Co., Ltd., New Taipei City (TW)

(72) Inventors: Yun-Fu Chen, New Taipei City (TW); Wei-Tse Hsu, New Taipei City (TW); Min-Sheng Chu, New Taipei City (TW); Chien-Li Yang, New Taipei City (TW); Tsu-Hsiang Lin, New Taipei City (TW); Yuan-Hong Huang, New Taipei City (TW)

(73) Assignee: Winsheng Material Technology Co., Ltd., New Taipei City (TW)

( * ) Notice: Subject to any disclaimer, the term of this patent is extended or adjusted under 35 U.S.C. 154(b) by 322 days.

(21) Appl. No.: 18/355,734

(22) Filed: Jul. 20, 2023

(65) Prior Publication Data

US 2025/0027227 A1     Jan. 23, 2025

(51) Int. Cl.
| | |
|---|---|
| *C30B 23/00* | (2006.01) |
| *C30B 23/02* | (2006.01) |
| *C30B 29/36* | (2006.01) |
| *C30B 33/02* | (2006.01) |

(52) U.S. Cl.
CPC ............ *C30B 23/002* (2013.01); *C30B 23/02* (2013.01); *C30B 29/36* (2013.01); *C30B 33/02* (2013.01)

(58) Field of Classification Search
CPC ....... C30B 23/00; C30B 23/002; C30B 23/02; C30B 23/06; C30B 29/00; C30B 29/10; C30B 29/36; C30B 33/00; C30B 33/02; C30B 35/00; C30B 35/002; C30B 35/007
USPC ........ 117/84–86, 88, 94, 106, 200–202, 204, 117/937, 951
See application file for complete search history.

(56) References Cited

FOREIGN PATENT DOCUMENTS

| | | | | | |
|---|---|---|---|---|---|
| KR | 20110095433 | A | * | 8/2011 | ........... C30B 23/002 |
| KR | 20120130030 | A | * | 11/2012 | ........... C30B 35/002 |

\* cited by examiner

*Primary Examiner* — Kenneth A Bratland, Jr.
(74) *Attorney, Agent, or Firm* — Wang Law Firm, Inc.

(57) ABSTRACT

Provided are a silicon carbide crystal growth device and a quality control method. The device includes: an annealing unit, a crystal growth unit, an atmosphere control unit, and a transport system; the atmosphere control unit provides a gas environment with low water, oxygen and nitrogen; the transport system transports a plurality of target objects after high-temperature purification by the annealing unit to the atmosphere control unit; after assembling silicon carbide seed crystal and silicon carbide powder in a graphite crucible and covering with thermal insulation material to form a container inside the atmosphere control unit, the transport system transports the container to the crystal growth unit. The method uses a weighing system in a chamber of the crystal growth unit to detect a weight change of silicon carbide seed crystal and silicon carbide powder during a crystal growth process through a plurality of weight sensors of the weighing system.

5 Claims, 9 Drawing Sheets

QUALITY CONTROL METHOD FOR GROWING SILICON CARBIDE CRYSTAL

BACKGROUND OF THE INVENTION

1. Field of the Invention

The present invention relates generally to a crystal growth device and a quality control method for silicon carbide crystals, which integrates an annealing unit and a crystal growth unit to improve the efficiency of a crystal growth process, and can judge abnormal situations in advance in the crystal growth process by detecting a weight change of a container.

2. The Prior Arts

Silicon carbide (SiC) single crystal (or monocrystal) substrates are categorized as the third generation semiconductors. With the characteristics of high voltage resistance and high frequency, silicon carbide single crystal substrates can be used in power semiconductors in the fields of national defense, aerospace, industry, automobiles and consumer electronics industries.

To produce silicon carbide single crystal substrates, it is necessary to start from growing silicon carbide single crystals. The process is to pour the silicon carbide powder into the graphite crucible disposed inside the thermal insulation material of the container, then put the container into the crystal growth furnace. The silicon carbide powder is sublimated in a high-temperature and closed space, so that the steam of the crystal source powder is condensed and attached to the silicon carbide crystal seed.

The growth of silicon carbide can be said to be a "black box operation", because it needs to be maintained in a high temperature (greater than 2100° C.) environment during the manufacturing process, and must maintain a low pressure and a long-term stable state. During the process, it is completely impossible to observe the changes in the crystal growth from the outside, which also means that the quality and results of the production can only be revealed at the last moment.

Because the crystallization of silicon carbide in the graphite crucible cannot be observed, to be well controlled so that the atoms of silicon carbide can be properly arranged and attached to the initial silicon carbide seed crystal, in addition to the quality of the silicon carbide seed crystal, other factors such as thermal field design and graphite crucible material affecting the quality of the substrate are also very important.

For the part that the graphite crucible material affects the quality of the substrate, it is known that before silicon carbide growth, it is necessary to use high temperature to anneal the graphite crucible in the container and related components, materials and other targets to purify, so as to prevent the silicon carbide powder loaded into the graphite crucible from being affected by impurities on the graphite crucible.

Traditionally, silicon carbide wafer manufacturers need to send the container containing the graphite crucible and related components to a professional heat treatment company for annealing, or build their own annealing factory before growing the crystal. However, regardless of whether it is an external or a self-built annealing treatment plant, graphite crucibles and related components must return from the annealing treatment place after high-temperature purification treatment, so that they are easily polluted by the external environment during the returning process. If the probability of contamination is to be reduced to a minimum, a clean delivery process must be set up, which is potentially costly. In addition, the transportation of objects such as cavities back and forth between the crystal growth factory and the annealing treatment factory also increases a lot of costs and risks.

SUMMARY OF THE INVENTION

A primary objective of the present invention is to provide a silicon carbide crystal growth device that integrates the annealing unit and the crystal growth unit, and can detect the weight change of the container during the crystal growth process to judge the process abnormality in advance. With the crystal growth device of the present invention, objects such as the container with graphite crucible inside and other components can be annealed and purified without leaving a clean environment, and can be directly transported to the working platform to be filled with silicon carbide powder and other components before transporting to the crystal growth unit to carry out the crystal growth process, and detect the weight change of the container during the crystal growth process to judge the process abnormality in advance; thereby, the engineers can adjust or correct the process in real time according to the situation, and will waste process time because the crystal growth process is completely impossible to observe from the outside, thereby improving the quality and production efficiency of crystal growth, and reducing manufacturing costs.

To achieve the foregoing objective, the present invention provides a silicon carbide crystal growth device, comprising: an annealing unit for performing a high-temperature purification process on a plurality of target objects; a crystal growth unit, used to carry out a crystal growth process on a container contained in the target objects, a silicon carbide seed crystal and a silicon carbide powder placed in a graphite crucible inside of the container; an atmosphere control unit, connected to the annealing unit and the crystal growth unit, and providing a gas environment with low water, oxygen, and nitrogen; wherein the target objects after the high-temperature purification process through the annealing unit being transported to the atmosphere control unit, and after assembling the target objects in the atmosphere control unit, the target objects being transported to the crystal growth unit to carry out the crystal growth process; and a first weighing system, disposed on a first plate of the crystal growth unit for supporting the container, to detect a weight change of the container during the growth process of the silicon carbide crystal, wherein the first weighing system comprises at least two first weight sensors distributed along a periphery of the first plate, and the first weight sensors being electrically connected to a processor of a computer system. As such, the target objects do not need to leave the clean environment after annealing and purification treatment, and can be directly assembled in the clean environment, and then transported to the crystal growth unit for the crystal growth process; and, when the weight sensors located at different positions sense different weight changes, the detected weight can be converted into digital data, sent to the processor of a computer system for analysis and processing, and recorded by a storage unit. By recording the weight change of the container along the crystal growth time axis for early judgment of the quality of crystal growth, engineers can immediately adjust or correct the process in response to the situation when an abnormal situation is found, thereby improving the quality and production efficiency of crystal growth products, and reducing manufacturing costs.

Another embodiment of the present invention may also include: an annealing unit, for performing a high-temperature purification process to the target objects; and an atmosphere control unit, connected to the annealing unit and the crystal growth unit, and providing a gas environment with low water, oxygen, and nitrogen, wherein the target objects after the high-temperature purification process through the annealing unit to be transported to the atmosphere control unit, and after the target objects being assembled in the atmosphere control unit, the target objects then transported to the crystal growth unit for the crystal growth process.

Preferably, the present invention may also include: a transport system, connected to the annealing unit, the atmosphere control unit, and the crystal growth unit, for transporting the target objects after the high-temperature purification process to the atmosphere control unit, and delivering the target objects assembled in the atmosphere control unit to the crystal growth unit.

Preferably, the present invention may also include: a working platform connected to the atmosphere control unit for assembling the target objects.

In an embodiment of the present invention, the transport system may include: a first track, disposed in the atmosphere control unit; a second track, disposed in the annealing unit; a third track, disposed in the crystal growth unit; and a trolley, having a plurality of first wheels to match the first track, and a plurality of second wheels to match the second track and the third track, respectively. Through the transport system, the trolley carries the target objects including the graphite crucible container to move between the closed annealing unit, the atmosphere control unit, and the crystal growth unit, so as to prevent the target objects after annealing and purification from leaving the purification environment, and is less polluted and can be assembled more quickly to improve work efficiency.

Preferably, the first track has a different track gauge from the second track and the third track, the second track has a same track gauge as the third track, and the plurality of first wheels and the plurality of the second wheels have a different wheel distance. With the "broken track" design of different track gauges, the annealing unit, atmosphere control unit, and crystal growth unit can be arranged in environments with height differences or different terrains, so that the transportation of trolleys can be maintained smoothly.

In an embodiment of the present invention, the atmosphere control unit has a gas control system for controlling the contents of water, oxygen, and nitrogen in the atmosphere control unit to be lower than 100 ppm. Thereby, adverse effects of water, oxygen, and nitrogen on the annealed and purified graphite crucible are controlled.

Preferably, the content of water, oxygen, and nitrogen in the atmosphere control unit is controlled in the range of 10 ppm-1 ppb.

Preferably, the gas control system may also include an inert gas supply part and a pressure valve for supplying inert gas into the atmosphere control unit and maintaining a positive pressure above an atmospheric pressure at 760 torr to 770 torr. With the positive pressure maintained in the atmosphere control unit, impurities in the external air can be prevented from entering the atmosphere control unit to cause pollution and affect the quality of the annealed and purified target objects including graphite crucibles.

Preferably, the annealing unit may have an inlet for inserting the target objects that have not been subjected to the high-temperature purification process; the crystal growth unit has an outlet for taking out the target objects that have completed the crystal growth process and crystals; and, the working platform has an inlet and outlet connected to the atmosphere control unit for operating and assembling the target objects.

Preferably, the atmosphere control unit has a thermal exchange system for heat exchange between the inside and outside of the atmosphere control unit.

An embodiment of the present invention may also include: a second weighing system, arranged under a second plate of the annealing unit, to detect the weight change of the container during the high-temperature purification process, the second weighing system comprises at least two second weight sensors distributed along the periphery of the second plate, and the second weight sensors are electrically connected to a processor of a computer system, wherein the first plate and the second plate are discs, and the first weight sensors and the second weight sensors are equiangularly distributed along the circumference of the first plate and the second plate, respectively.

In another embodiment of the present invention, the first plate and the second plate are discs, and the first weight sensors and the second weight sensors are respectively positioned along a circumference of the first plate and the second plate, and are equiangularly and radially distributed.

In an embodiment of the present invention, the first weighing system is used to sense the weight change when the silicon carbide seed crystal is dropped into the graphite crucible of the container, or the weight change caused by skewing and imbalance during the crystal growth process; the second weighing system is used to sense the weight change of the container after impurities are removed during an annealing process.

The present invention also provides a method for controlling the quality of silicon carbide crystal growth, comprising: disposing a first weighing system on a first plate of a crystal growth unit to detect the weight change of a silicon carbide seed crystal and a silicon carbide powder in the graphite crucible of a container during a crystal growth process, wherein the first weighing system has at least two first weight sensors distributed along a periphery of the first plate, the first weight sensors are electrically connected to a processor of a computer system, and each of the first weight sensors send a digital data to the processor of a computer system after independently sensing the weight change of the corresponding position of the container. As such, when the weight sensors at different positions sense different weight changes, it is possible for engineers to adjust or correct the process in real time.

Another embodiment of the quality control method of the present invention may further comprise: connecting an atmosphere control unit between the crystal growth unit and the annealing unit for providing a gas environment with low water, oxygen, and nitrogen, wherein the annealing unit is provided with a second weighing system to detect a weight change of the container placed on the second plate during the high-temperature purification process, wherein the second weighing system has at least two second weight sensors distributed along a periphery of the second plate, the second weight sensors are electrically connected to the processor of a computer system, and each of the second weight sensors send a digital data to the processor of a computer system after independently sensing the weight change of the corresponding position of the container.

According to the quality control method of silicon carbide crystal growth provided by the present invention, the first plate and the second plate are discs, and the first weight sensors and the second weight sensors are respectively positioned along a circumference of the first plate and the second plate, and are equiangularly distributed.

According to the quality control method of silicon carbide crystal growth provided by the present invention, the first plate and the second plate are discs, and the first weight sensors and the second weight sensors are respectively positioned along a circumference of the first plate and the second plate, and are equiangularly and radially distributed.

According to the quality control method of silicon carbide crystal growth provided by the present invention, the first weighing system is used to sense the weight change when the silicon carbide seed crystal is dropped into the graphite crucible of the container, or the weight change caused by skewing and imbalance during the crystal growth process; the second weighing system is used to sense the weight change of the container after impurities are removed during the annealing process.

The present invention detects the weight changes at different positions of the container at any time during the silicon carbide crystal growth process, which helps engineers to instantly understand whether the crystals in production are flawed so as to adjust or correct the process flexibly, without waiting until the long process is completed and the defect is discovered at the end of the crystal, resulting in a waste of process time, thereby improving production efficiency and reducing manufacturing costs.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

The terminology used herein is used to describe particular embodiments only, and is not intended to limit the present invention. As used herein, the singular terms "a" and "the" are intended to include the plural forms as well, unless the context clearly dictates otherwise. As used herein, the term "and/or" includes any and all combinations of one or more of the associated listed items. It will be understood that when an element is referred to as being "connected" or "coupled" to another element, it can be directly connected or coupled to the other element or intervening elements may be present.

Figure 1:
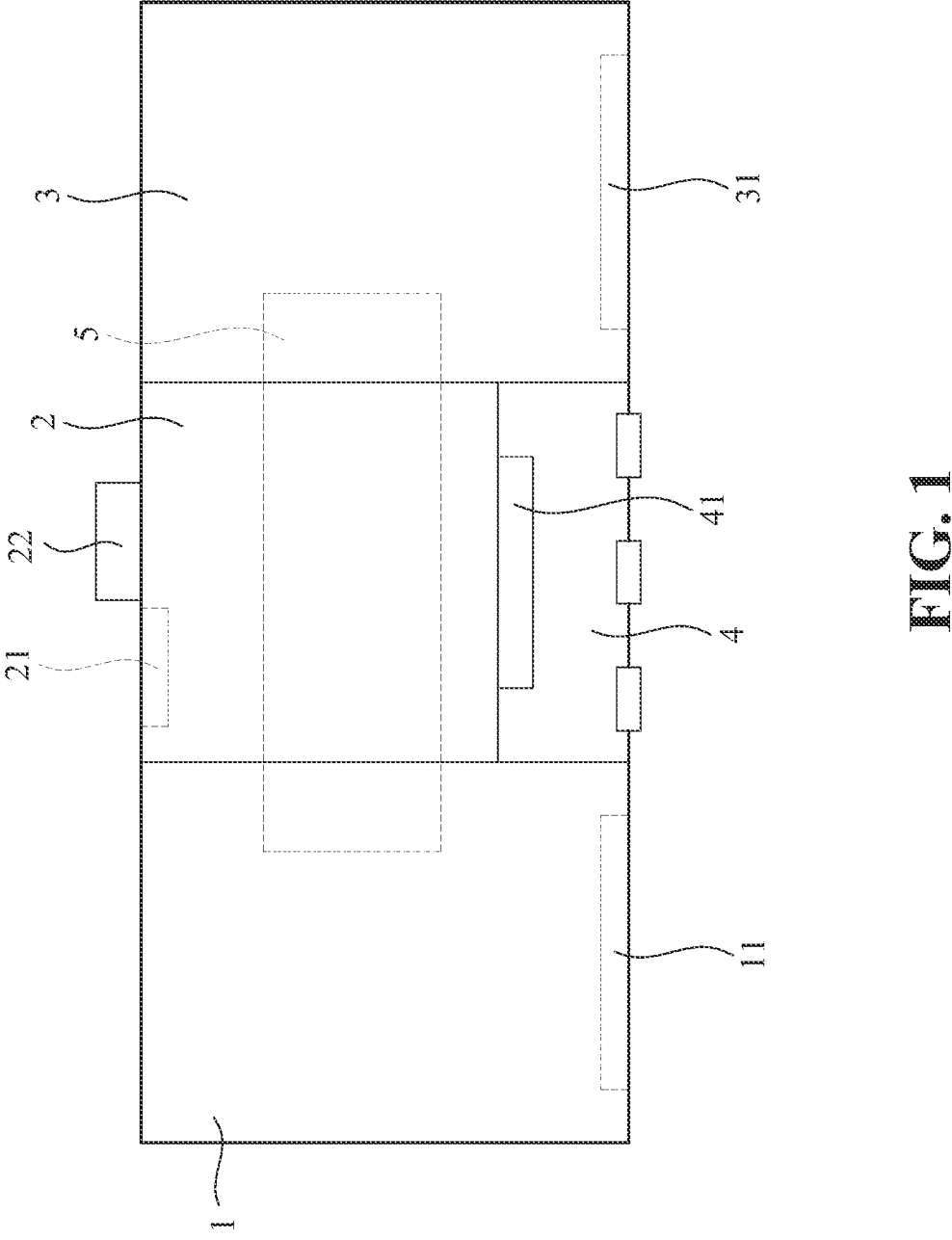
FIG. 1 is a schematic top planar view showing the structure of the silicon carbide crystal growth device of the present invention.
Figure 2:
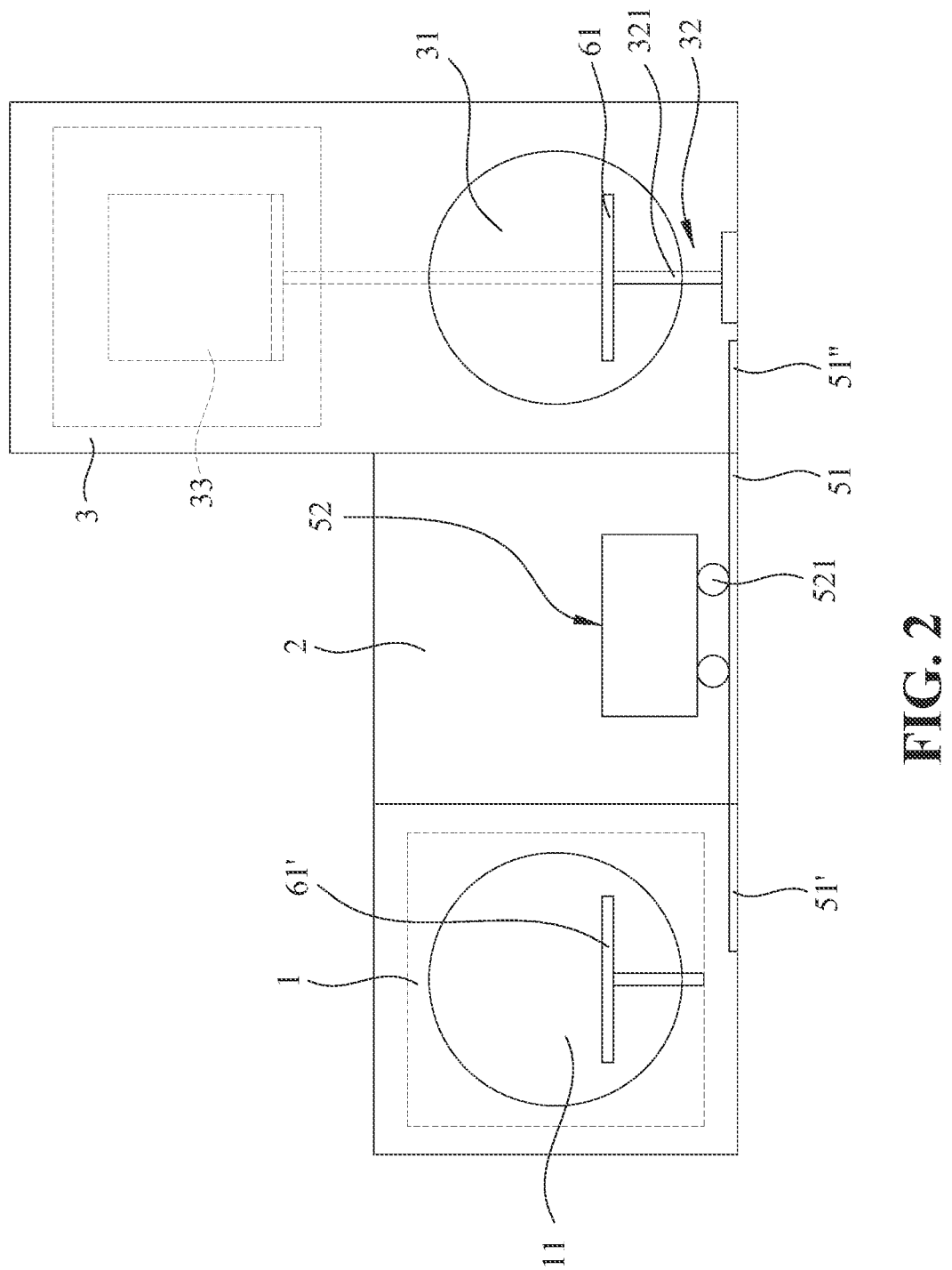
FIG. 2 is a schematic front planar view showing the structure of the silicon carbide crystal growth device of the present invention.
Figure 7:
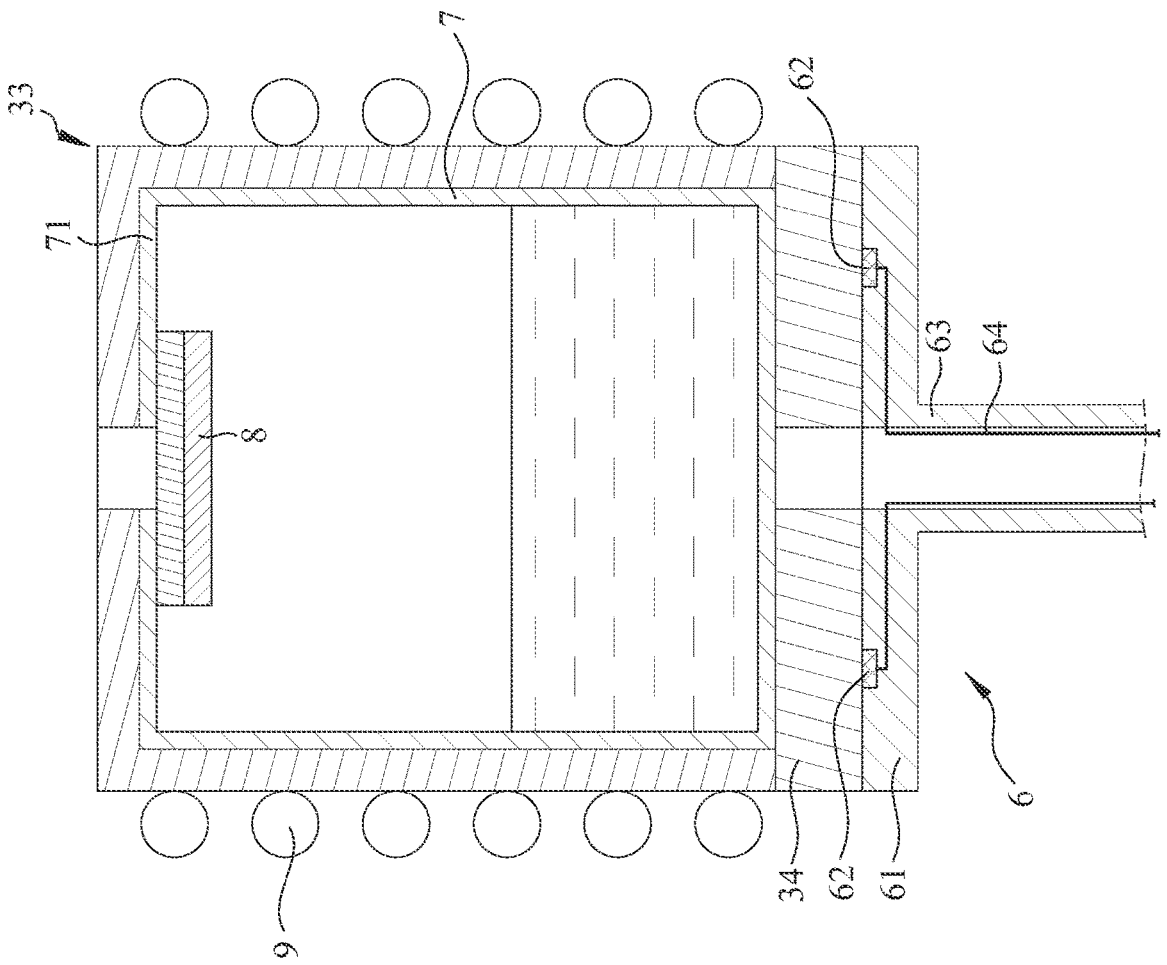
FIG. 7 is a schematic view showing an embodiment of the present invention in which a weighing system is disposed in a crystal growth unit.

As shown in FIG. 1 and FIG. 2, the silicon carbide crystal growth device provided by the present invention integrates an annealing unit 1, an atmosphere control unit 2, a crystal growth unit 3, and a working platform 4, so that the graphite crucible 7 to be loaded with silicon carbide seed crystal and silicon carbide powder does not need to leave a clean working environment from entering the annealing unit 1, assembling the silicon carbide seed crystal and silicon carbide powder, covering a thermal insulation material 34 until completing the crystal growth process and taking out the crystal growth unit. The entire process is completed in one go. As shown in FIG. 7, the graphite crucible 7 is covered with the thermal insulation material 34 to form a container 33 after filling silicon carbide seed crystal and silicon carbide powder.

The annealing unit 1 is the equipment used to carry out high-temperature purification processes for target objects, such as graphite crucible 7, silicon carbide seed crystal and silicon carbide powder, before carrying out the crystal growth process. The annealing unit 1 is provided with an Inlet 11. When the target objects are put into the unit body of the annealing unit 1 through the inlet 11 and the inlet 11 is closed, the unit body is vacuumed (vacuum degree is lower than 1E-3 torr), and then heated to 2000-3000° C., the graphite crucible is purified by removing the gas adsorbed on the graphite crucible and the internal pores of the graphite at high temperature. At the same time, the halogen gas (HCl) can also be introduced into the unit body to eliminate the residue impurities, such as, metal pollutants, but not limited to this, during graphite crucible processing, to reduce polycrystalline generation, stabilize resistivity, and generate high-quality silicon carbide single crystals.

The annealing unit 1 is provided with a heat exchange device (not shown in the figure), which is used to exchange heat inside and outside the annealing unit 1 to quickly eliminate the internal high temperature generated by the annealing process. Through special design, the heat exchange device can be integrated with automation equipment, and the sensor will automatically open the door to dissipate heat when the temperature inside the unit body reaches 500° C. The heat exchange device can, for example, guide the heat exchange fluid into the annealing unit 1 through pipelines to absorb heat and then guide the fluid to the outside. Then, air cooling or liquid cooling can be used to remove the heat absorbed by the heat exchange fluid and then the fluid is guided into the annealing unit 1 again to absorb heat, and the heat exchange process is carried out in such a cycle.

The atmosphere control unit 2 is used to connect the annealing unit 1 and the crystal growth unit 3 in a closed manner, and includes a gas control system 21 disposed inside therein. A transport system 5 is provided for connecting the annealing unit 1, the atmosphere control unit 2, and the crystal growth unit 3, and the transport system 5 is used to transport the target objects, including the graphite crucible 7, silicon carbide seed crystal, and silicon carbide powder after the high-temperature purification through the annealing unit 1 to the atmosphere control unit 2, the silicon carbide seed crystal and silicon carbide powder are then placed into the graphite crucible 7 in the atmosphere control unit 2, and then the thermal insulation material 34 is used to cover the graphite crucible 7 to form the container 33. The transport system 5 then transports the container 33 and other objects to the crystal growth unit 3 to perform the crystal growth process.

The transport system 5 includes: a first track 51, a second track 51', a third track 51", and a trolley 52 provided on the first track 51, the second track 51', and the third track 51", wherein, the first track 51 is arranged in the atmosphere control unit 2, the second track 51' is arranged in the annealing unit 1, and the third track 51" is arranged in the crystal growth unit 3. The first track 51 has a different track gauge from the second track 51' and the third track 51", but the second track 51' has the same track gauge as the third track 51". In the embodiment of the invention shown in the figure, the track gauge P1 of the first track 51 can be smaller than the track gauge P2 of the second track 51' and the third track 51", but the track gauge is not limited therein. In actual situations, the track gauge P1 of the first track 51 can be larger than the track gauge P2 of the second track 51' and the third track 51" according to practical applications. The two ends of the first track 51 form a separate, discontinuous "broken track" design because of the different track gauges of the second track 51' and the third track 51". Because different equipments may have different heights, therefore it is beneficial to deploy the annealing unit 1, the atmosphere control unit 2, and the crystal growth unit 3 in an environment with a difference in height or other topography. In other words, because the first track 51 and the second and third tracks 51', 51" are not continuous, the first track 51 and the second and third tracks 51', 51" can be laid in environments with height differences or other different terrains, thereby increasing the flexibility of the location of the crystal growth device.

Figure 3:
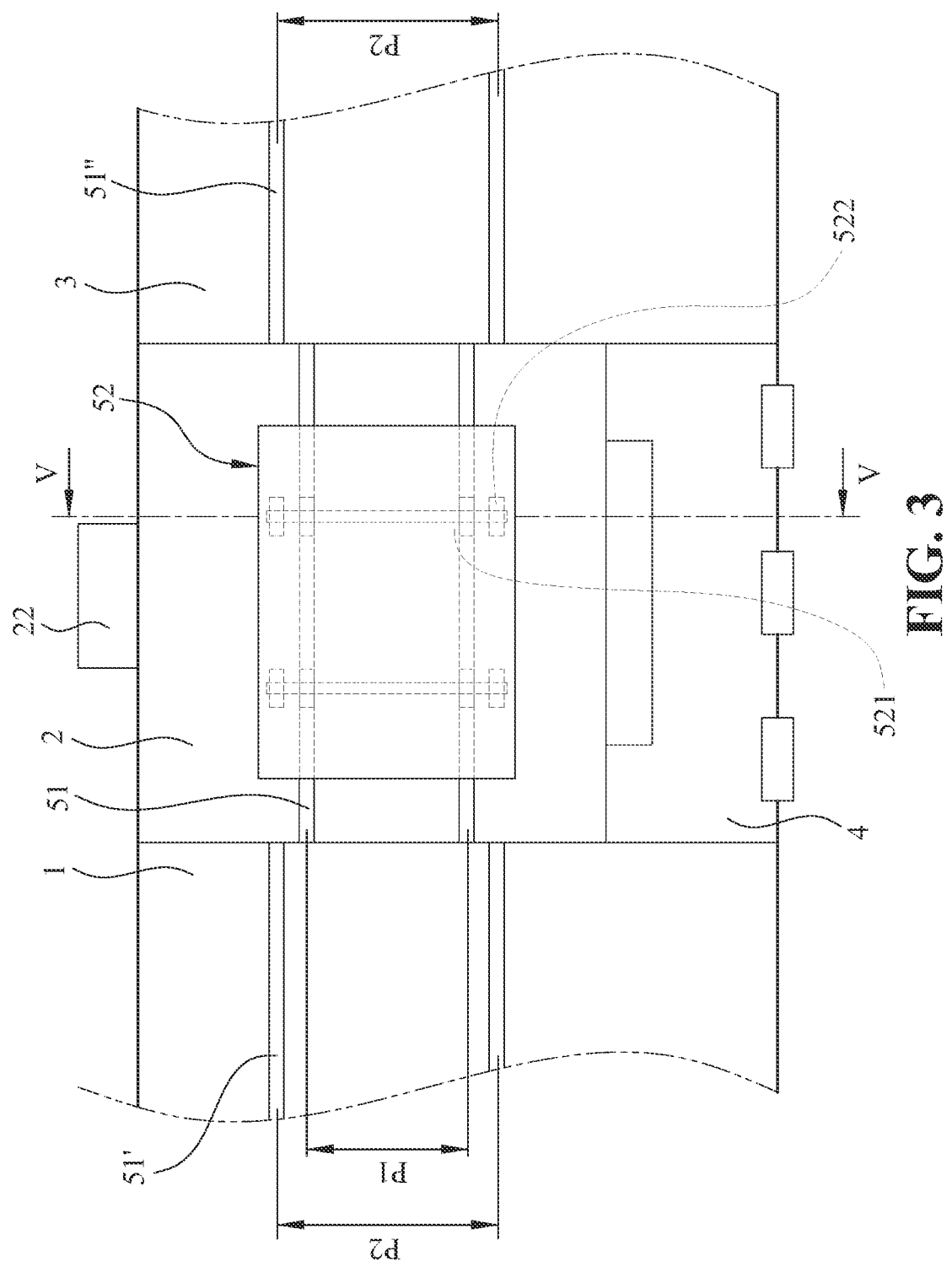
FIG. 3 is the enlarged schematic view showing the partial top view of the structure of the transport system of the present invention.
Figure 4:
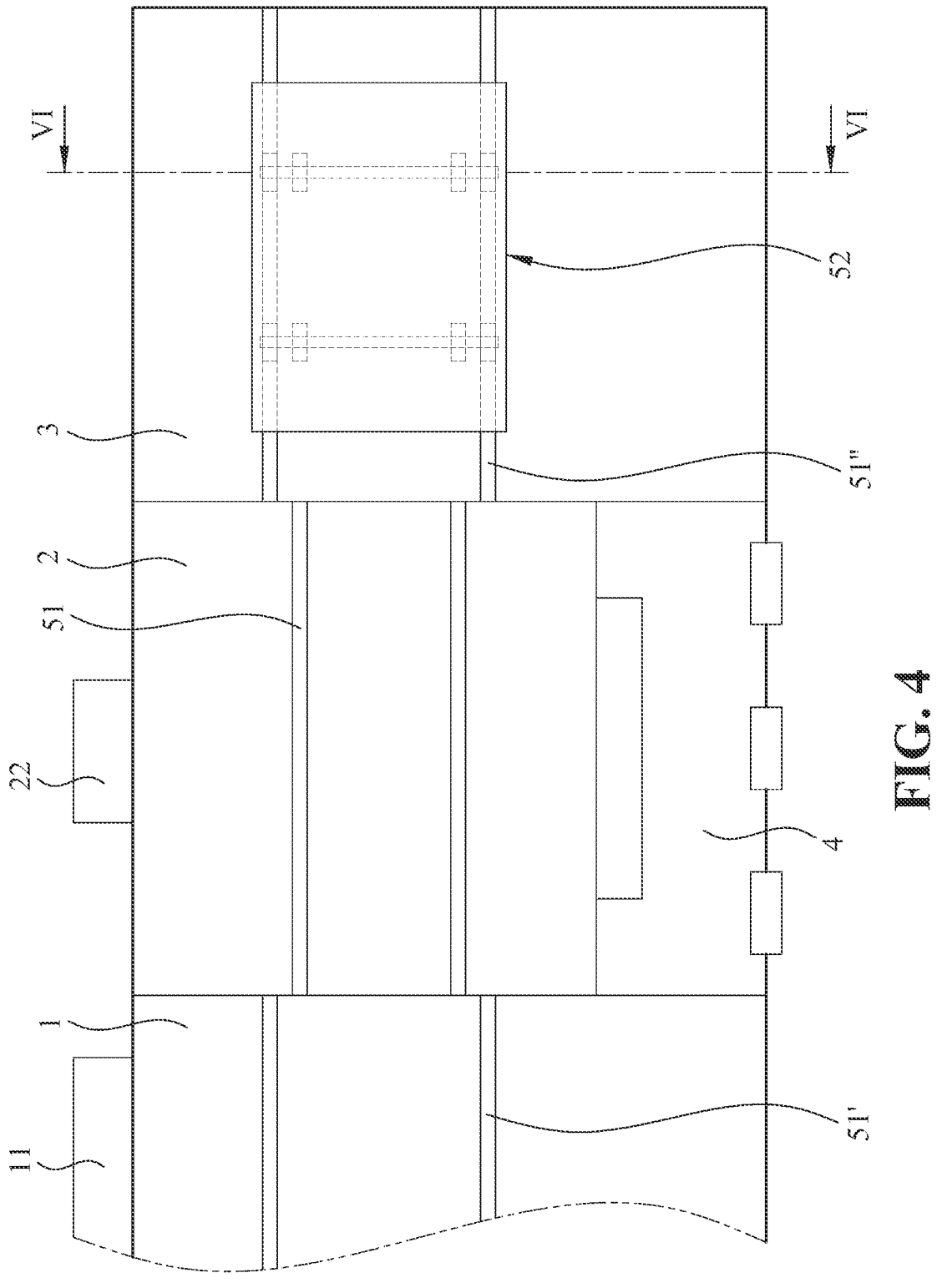
FIG. 4 is a schematic top planar view showing the trolley of the transport system of the present invention moving to the crystal growth unit.
Figure 5:
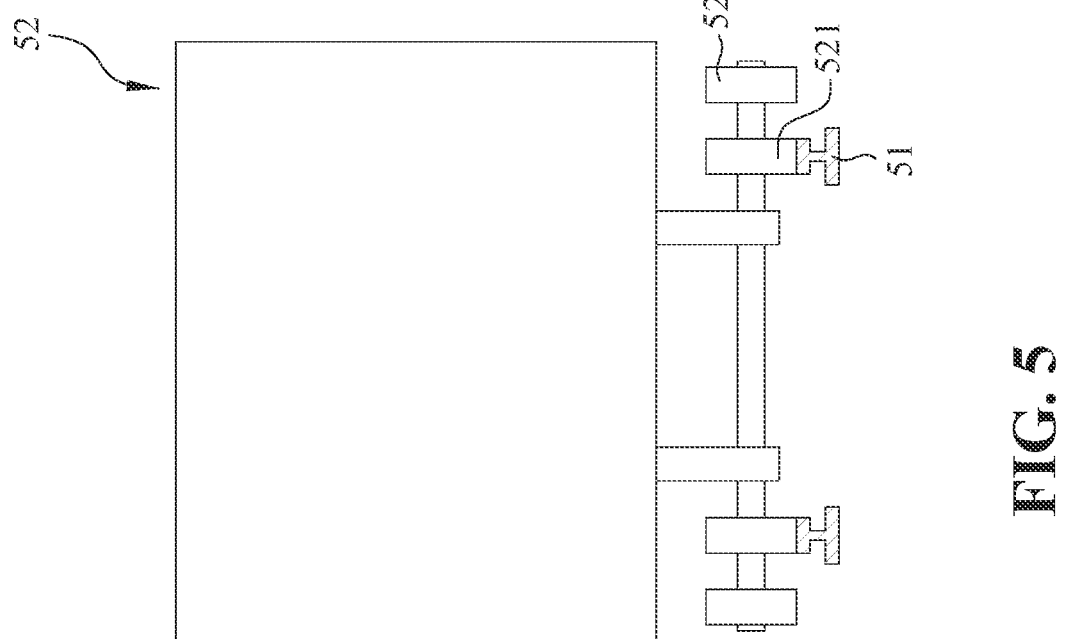
FIG. 5 is a schematic planar view showing the wheels of the trolley of the transport system of the present invention located on the first track of the atmosphere control unit.
Figure 6:
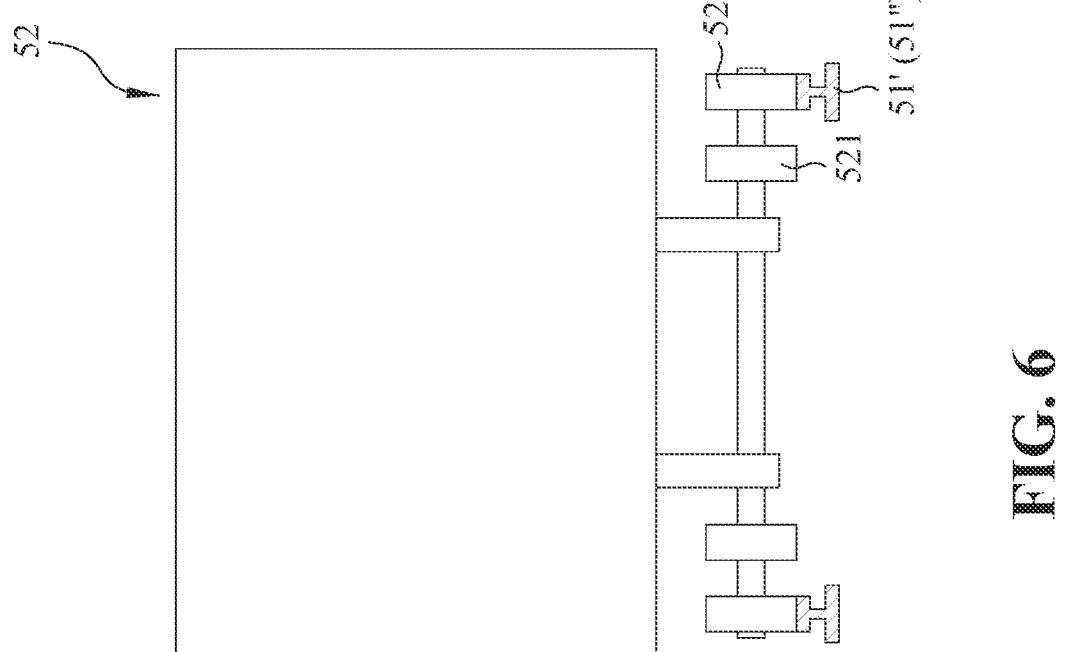
FIG. 6 is a schematic planar view showing the wheels of the trolley of the transport system of the present invention located on the second track of the annealing unit or the crystal growth unit.

The trolley 52 has a plurality of first wheels 521 that can match the first track 51, and a plurality of second wheels 522 that match the second track 51' and the third track 51", respectively. Specifically, as shown FIG. 3 and FIG. 5, the first wheels 521 and the second wheels 522 are arranged in pairs and coaxially below the trolley 52, and the wheel distance of each pair of coaxial first wheels 521 is smaller than that of each coaxial second roller 522. The wheel distance of every coaxial pair of first wheels 521 is equal to the track gauge of the first track 51, and the wheel distance of every coaxial pair of second wheels 522 is equal to the track gauge of the second track 51' and the third track 52". Accordingly, when the trolley 52 is located in the atmosphere control unit 2, the first wheels 521 roll on the first track 51, and the second wheels 522 are suspended; when the trolley 52 moves from the atmosphere control unit 2 to the annealing unit 2, the second wheels 522 roll on the second track 51', and the first wheels 521 are suspended; and when the trolley 52 moves from the atmosphere control unit 2 to the crystal growth unit 3, the second wheels 522 roll on the third track 51" (as shown in FIGS. 4 and 6), and the first wheels 521 are suspended; when the trolley 52 moves from the annealing unit 1 or the crystal growth unit 3 to the atmosphere control unit 2, the first wheels 521 run on the first track 51, and the second wheels 522 are suspended. As such, the track switching of the trolley 52 among the annealing unit 1, the atmosphere control unit 2, and the crystal growth unit 3 can run smoothly.

The gas control system 21 can control the content of water, oxygen, and nitrogen in the atmosphere control unit 2. Preferably, the content of water, oxygen, and nitrogen is lower than 100 ppm, ideally 10 ppm-1 ppb, and inert gases, such as Argon, can be used to provide the cleanliness of the environment in the atmosphere control unit 2, and to prevent the target objects, such as graphite crucibles purified by the annealing unit 1, from being polluted inside the atmosphere control unit 2. When the gas control system 21 supplies inert gas, the pressure valve can be used to control the pressure in the atmosphere control unit 2 to maintain a slightly positive pressure of 760 torr to 770 torr, which is higher than the atmospheric pressure, so as to avoid external air from infiltrating into the atmosphere control unit 2 to pollute the annealed and purified graphite crucible.

The working platform 4 is connected to the atmosphere control unit 2, to facilitate the staff to operate equipment to install silicon carbide seed crystal and silicon carbide powder into the graphite crucible 7 and cover the shell-shaped heat-insulating material 34. In the practical process of the present invention, the target objects, such as graphite crucibles, silicon carbide seed crystal, and silicon carbide powders, purified by the annealing unit 1 are transported to the atmosphere control unit 2 by the trolley 52. In such a state, the staff deployed at the working platform 4, through the entrance and exit 41 and the intermediary equipment of a clean environment commonly known as "glove box", installs the silicon carbide seed crystal on the top of the lid of the graphite crucible 7, installs the silicon carbide powder into the graphite crucible, and covers the lid on the graphite crucible, followed by covering with the heat-insulating material 34 to form the container 33. The, the container 33 is transported to the crystal growth unit 3 by the trolley 52 to perform the crystal growth process.

Moreover, a thermal exchange system 22 can also be provided outside the atmosphere control unit 2 for exchanging heat between the inside and outside of the atmosphere control unit 2 to quickly remove the high temperature inside the atmosphere control unit 2. The thermal exchange system 22 can, for example, guide the heat exchange fluid to the atmosphere control unit 2 through pipelines to absorb heat and then guide the fluid to the outside, and then use air cooling or liquid cooling to remove the heat absorbed by the heat exchange fluid and then guide the fluid to enter the atmosphere control unit 2 again to absorb heat, so that the heat exchange process is carried cyclically.

The crystal growth unit 3 is a device for carrying out the crystal growth process on the silicon carbide seed crystal and silicon carbide powder installed into the graphite crucible 7 of the container 33. The crystal growth unit 3 has an outlet 31 for taking out the container 33 and the crystal that have completed the crystal growth process. More specifically, as shown in FIGS. 1 and 2, the crystal growth unit 3 includes a lifting mechanism 32 positioned below and a crystal growth furnace positioned above. The lifting mechanism 32 comprises a driving device 321 and a first plate positioned at the top end of the driving device 321. The driving device 321 can be, for example, a screw cylinder, a pneumatic cylinder or an oil hydraulic cylinder, and is used to vertically transport the first plate 61 into or out of the chamber of the crystal growth furnace. More specifically, after the silicon carbide seed crystal and silicon carbide powder are installed in the atmosphere control unit 2 in the graphite crucible 7 and covered with the thermal insulation material 34, they are then transported to the crystal growth unit 3 by the trolley 52, and are placed in the crystal growth unit 3 through the aforementioned trolley or mechanical arm (not shown in the figure) on the track of the "broken track" design for transferring the container 33 to the first plate 61, and then the first plate 61 and the container 33 carried thereon will be lifted by the lifting mechanism 32 to move up into the chamber of the crystal growth furnace, and the crystal growth process begins after the outlet 31 and related inlets and outlets are closed. After the crystal growth process is completed, when the temperature drops to an appropriate temperature, the outlet 31 is opened to remove the container 33 and take out the crystal.

In addition, as shown in FIG. 7, the present invention can also dispose the first weighing system 6 in the crystal growth unit 3 to detect the micro weight change of the container 33 in the crystal growth process (the variation range of detection can be 0.01 g~100 g). The quality of crystal growth can be judged by recording the weight change of the container 33 along the crystal growth time axis, so as to judge the abnormal situation of the process in advance, and thereby the engineers can adjust or correct the process in real time according to the situation. The quality of the product will not be affected simply because the crystal growth process cannot be observed from the outside to see the changes in the internal crystal growth.

Figure 8:
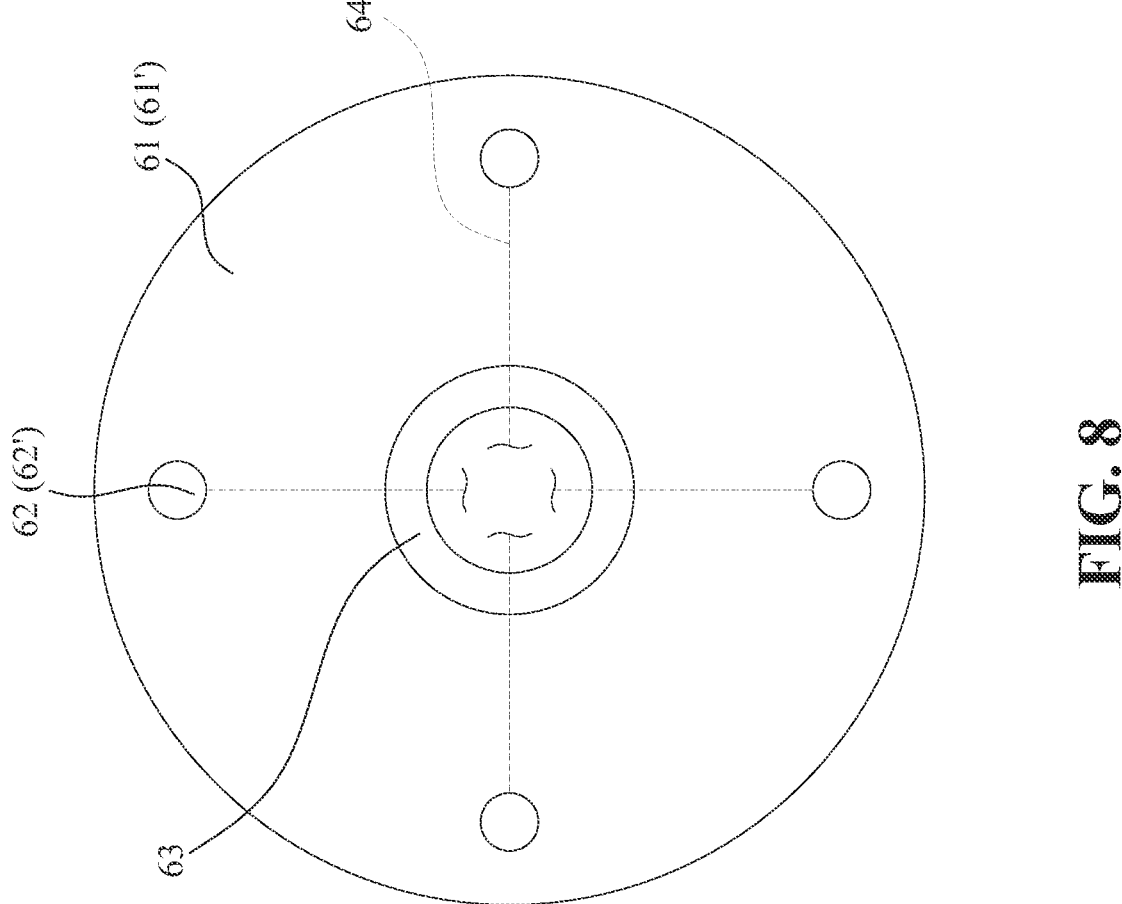
FIG. 8 is a schematic view showing one embodiment of the weight sensor of the weighing system of the present invention.
Figure 9:
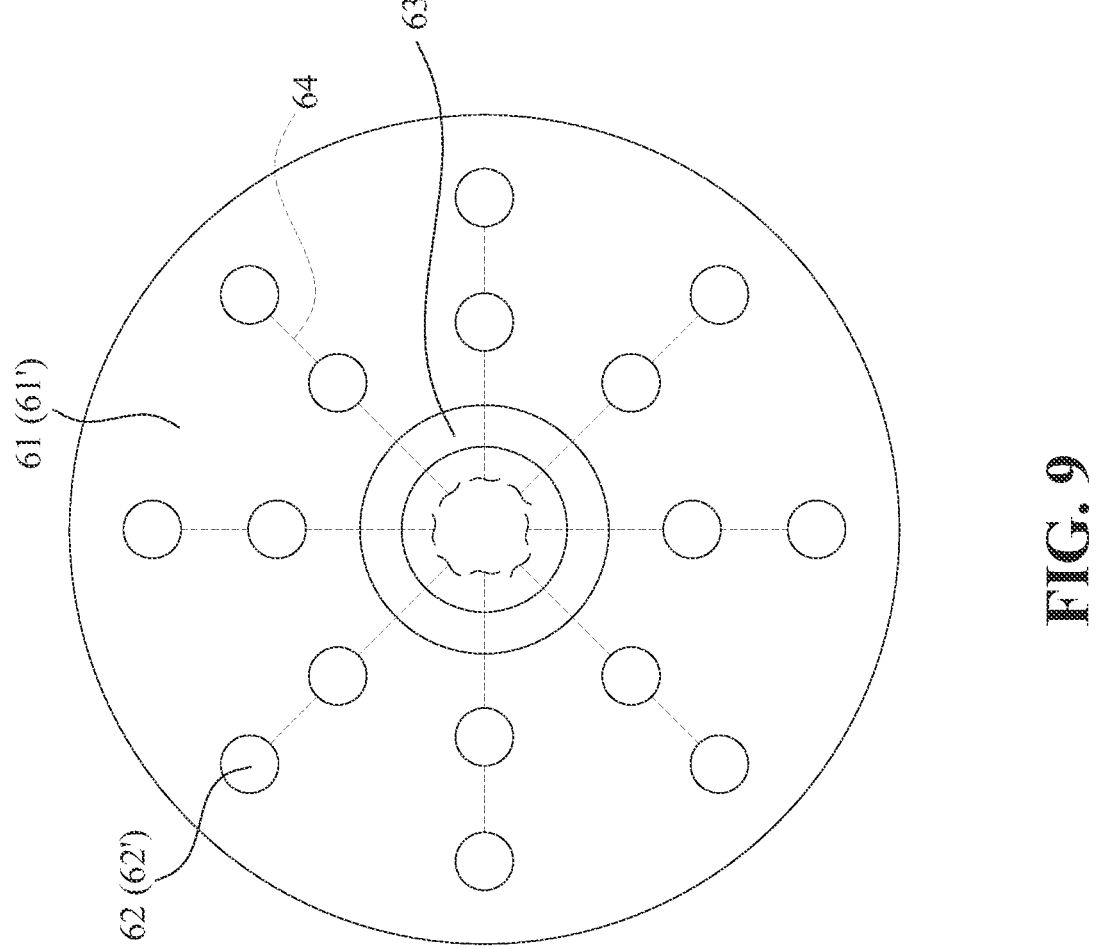
FIG. 9 is a schematic view showing another embodiment of the weight sensor of the weighing system of the present invention.

Specifically, due to various factors in the growth process of silicon carbide crystals, various factors may cause the grown crystals to partially drop or result in defects, resulting in lighter weight at positions where there are local drops or defects, so that the weight of the container 33 produces an unbalanced fluctuation phenomenon at the moment when the crystal generates a defect, for example, the crystal is tilted and causes uneven weight, or the moment when part of the material of the crystal falls to the graphite crucible 7 of the container 33 to cause weight changes, etc. Therefore, as shown in FIG. 7, the present invention arranges the first weighing system 6 on the first plate 61 to sense the weight of the thermal insulation material 34 and the graphite crucible 7 of the weight of the container 33 carried on the first plate 61. For example, the first weighing system 6 can distribute a plurality of first weight sensors 62 along the periphery of the first plate 61, an extension tube 63 extends from the center of the first plate 61, and the first plate 61 extends to the outside of the crystal growth unit 3 through the extension tube 63. The first weight sensors 62 are connected by wires 64 and the wires 64 pass through the extension tube 63 to be electrically connected to the computer system. In addition, the appropriate position of the extension tube is also provided with an infrared pyrometer (not shown). The infrared pyrometer is electrically connected to the processor of a computer system to sense the temperature at the bottom of the graphite crucible 7 after the graphite crucible 7 inside the container 33 is heated by a heater 9. In one of the embodiments of the present invention, the first plate 61 can be a disc, and a plurality of first weight sensors 62 are equiangularly distributed along the circumference of the first plate 61 (as shown in FIG. 8). In another embodiment, the first plate 61 can be a disc, and a plurality of first weight sensors 62 are equiangularly and radially distributed along the circumference of the plate (as shown in FIG. 9). The quantity and distribution density of the first weight sensor 62 can be changed according to actual needs. When the quantity and density are higher, the more weight change positions can be detected, and the detection is more precise. By arranging the first weight sensors 62 equiangularly on the first plate 61, the position of abnormal weight can be detected more evenly. Accordingly, when the crystal

8 grows downward from the lid 71 at the upper end of the graphite crucible 7, a local crystal drop or defect occurrence will cause the weight fluctuation of the container 33 at the corresponding position, thereby the first weight sensor 62 at the position adjacent to the drop or defect will immediately detect that the weight of this position is different from other positions (the detection fluctuation range can reach 0.01 g-100 g), and then convert the relevant data into digital data and send to the computer system to be processed by the processor of a computer system and stored and recorded by the storage unit. Hence, relevant process engineers can make timely process adjustments or corrections based on the detected relevant information and data, avoiding unnecessary waste of process time, thereby reducing manufacturing costs.

In another embodiment of the present invention, a second weighing system 6' (as shown in FIG. 2) can also be disposed in the annealing unit 1 to detect the micro weight change of target objects, such as, graphite crucible, silicon carbide seed crystal and silicon carbide powder during the annealing process, and the detection range can be 0.01 g-100 g. The annealing quality can be judged by recording the weight change of these target objects after the impurities are removed during the annealing process, so as to judge the abnormal situation of the process in advance; thereby, the engineering personnel can adjust or correct the annealing process in real time according to the situation.

Specifically, since the target objects, such as, graphite crucible, silicon carbide seed crystal, and silicon carbide powder, may not be purified due to various factors during the annealing process, the impurities may not be removed in some positions and the weight is heavier than other positions. Therefore, in the present invention, the second weighing system 6' can be arranged under the second plate 61' inside the annealing unit 1 to sense the weight of the graphite crucible 7, silicon carbide seed crystal and silicon carbide powder. The second weighing system 6' has the same structure as the first weighing system 6, so the description will be made with reference to FIG. 7-9, that is, the second weighing system 6' may include a second plate 61', and a plurality of second weight sensors 62' are distributed around the second plate 61'. An extension tube 63 extends from the center of the second plate 61', and the second plate 61' extends through the extension tube 63 to the outside of the annealing unit 1. The second weight sensors 62' are connected through wires 64 and the wires 64 passed through the extension tube 63, and then electrically connected to the processor of the computer system. Likewise, the second plate 61' can be a disc, and a plurality of second weight sensors 62' are equiangularly distributed along the circumference of the second plate 61' (as shown in FIG. 8), or the plurality of second weight sensors 62' are equiangularly and radially distributed along the circumference of the second disc 61' (as shown in FIG. 9). The number and distribution density of the second weight sensors 62' can be changed according to actual needs. When the quantity and density are higher, the more weight change positions can be detected, and the detection is more precise. Moreover, by disposing the second weight sensor 62' equiangularly around the second plate 61', the position of abnormal weight can be detected more evenly. Accordingly, when the weight of the target object containing the graphite crucible 7 fluctuates during the annealing process because the impurities in some positions cannot be removed, the second weight sensor 62' corresponding to or close to the position can immediately detect, and the detected fluctuation range can reach 0.01 g-100 g. The relevant data is converted into digital data and then sent to the processor of the computer system for processing, and stored and recorded by the storage unit. Hence, relevant process engineers can make timely process adjustments or corrections based on the detected relevant information and data, avoiding unnecessary waste of process time, thereby reducing manufacturing costs.

The above examples only express the preferred implementation of the present invention, and its description is more specific and detailed, but it cannot be interpreted as a limitation of the patent scope of the present invention. It should be noted that those skilled in the art can make several changes and improvements without departing from the concept of the present invention, and these all belong to the protection scope of the present invention.

What is claimed is:

1. A quality control method for growing a silicon carbide crystal, comprising:

disposing a first weighing system on a first plate of a crystal growth unit to detect a weight change of a silicon carbide seed crystal and a silicon carbide powder in a graphite crucible of a container during a crystal growth process, wherein the first weighing system has at least two first weight sensors distributed along a periphery of the first plate, the first weight sensors are electrically connected to a processor of a computer system, and each of the first weight sensors sends a digital data to the processor of a computer system after a weight change detected at a location of each of the first weight sensors is measured.

2. The quality control method according to claim 1, further comprising: connecting a device for controlling atmosphere between the crystal growth unit and an anneal-ing unit for providing a gas environment with water, oxygen, and nitrogen, wherein the annealing unit is provided with a second weighing system to detect a weight change of the container placed on a second plate during a purification process, wherein the second weighing system has at least two second weight sensors distributed along a periphery of the second plate, the second weight sensors are electrically connected to the processor of the computer system, and each of the second weight sensors sends a digital data to the processor of the computer system after independently sensing the weight change of the corresponding position of the container.

3. The quality control method according to claim 2, wherein the first plate and the second plate are discs, and the first weight sensors and the second weight sensors are respectively positioned along a circumference of the first plate and the second plate, and are equiangularly distributed.

4. The quality control method according to claim 2, wherein the first plate and the second plate are discs, and the first weight sensors and the second weight sensors are respectively positioned along a circumference of the first plate and the second plate, and are equiangularly and radially distributed.

5. The quality control method according to claim 2, wherein the first weighing system is used to sense the weight change when the silicon carbide seed crystal is dropped into the graphite crucible of the container, or the weight change caused by skewing and imbalance during the crystal growth process; and the second weighing system is used to sense the weight change of the container after impurities are removed during an annealing process.

* * * * *